US006651211B1

(12) United States Patent
Abe et al.

(10) Patent No.: US 6,651,211 B1
(45) Date of Patent: Nov. 18, 2003

(54) METHOD OF MOBILE TELECOMMUNICATIONS

(75) Inventors: Masami Abe, Tokyo (JP); Toshio Kato, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/332,530

(22) Filed: Jun. 14, 1999

(30) Foreign Application Priority Data

Jun. 15, 1998 (JP) .......................... 10-166436

(51) Int. Cl.[7] ........................ H03M 13/17; H03M 13/35
(52) U.S. Cl. ........................ 714/762; 714/776
(58) Field of Search ................. 714/776, 762

(56) References Cited

U.S. PATENT DOCUMENTS

| 5,603,081 A | * | 2/1997 | Raith et al. ................. | 455/435 |
| 5,751,731 A | * | 5/1998 | Raith ........................ | 714/752 |
| 6,320,843 B1 | * | 11/2001 | Rydbeck et al. ............ | 370/207 |

FOREIGN PATENT DOCUMENTS

| JP | 07-015353 | 1/1995 |
| JP | 10-327109 | 12/1998 |

OTHER PUBLICATIONS

Atungsiri et al., "Multirate coding for mobile communication link", IEE Proc.–Commun., vol. 144, No. 3, Jun. 1997.*

* cited by examiner

Primary Examiner—Stephen M. Baker
(74) Attorney, Agent, or Firm—Venable LLP; Michael A. Sartori; Jeffrey W. Gluck

(57) ABSTRACT

A to-be-sent signal (20) is comprised of a header (21) and convolution encoded data (22). An error correcting code (23) has a capability to correct a bit error or burst error contained in an objective data (24) placed apart from the header (21) in said convolution encoded data (22). Because an error arises easily in data placed apart from a header compared with that positioned near said header generally, said error correcting code (23) is added to data placed apart from said header and the addition of said error correcting code is omitted in data placed near to said header, thereby reducing whole information contents and transmission power.

14 Claims, 4 Drawing Sheets

| A | DATA PLACED APART FROM A HEADER |
| B | QOS (QUALITY ASSURANCE INFORMATION) |
| C | HIGH ORDER BITS OF A MULTIVALUED VOICE SIGNAL |
| D | FEEDBACK DATA REFERENCED WHEN COMPRESSION ENCODING IS MADE |

METHOD OF MOBILE TELECOMMUNICATIONS

BACKGROUND OF THE INVENTION

The present invention relates to a method of mobile telecommunications and more particularly to a method of mobile telecommunications adapted to send an encoded voice signal.

Telecommunications using a mobile unit including a car phone, portable telephone, etc., has made rapid strides to meet the demands of the times. In mobile telecommunications, because a signal is received and sent through the medium of a radio wave, an error correction technology by which an error caused by noise can be corrected and an inputted signal can be regenerated faithfully is indispensable. Known technologies of error correction include a convolution encoding method, BCH method and RS (Reed-Solomon) method and the like. In the mobile telecommunications using a CDMA (Code Division Multiple Access) method, by introducing such error correction technologies therein, telecommunications of high quality have been implemented.

When information for error correction is added to a signal to be received or sent, information contents of the signal are increased. Increased information contents require more transmission power accordingly. However, in the case of mobile telecommunications using, for example, the CDMA method, the number of connections that can be made simultaneously within the same communication area (i.e., a communication area covered by one base station) is limited by maximum power that can be transmitted by a base station.

Therefore, in order to enable more simultaneous calls, information contents received or sent by each mobile unit must be minimized. This requirement is, however, contradictory to the requisite to assure the quality exceeding a specified level in the telecommunications of each mobile unit.

Moreover, if transmission power consumption can be reduced, mobile telecommunications time is able to be made longer because a mobile unit is allowed to be used until its battery has discharged all electricity.

SUMMARY OF THE INVENTION

The present invention has been made to solve problems described above and it is an object of the present invention to provide a method of mobile telecommunications to reduce transmission power required for sending with high error correcting capabilities maintained. According to the present invention, this object is achieved by methods described below:

1. A method of mobile telecommunications for sending a signal encoded after being sampled in a specified sampling cycle, with a header used for controlling added thereto, comprising a step of adding an error correcting code capable of error correction of only specified amounts of signals to specified amounts of signals placed most apart from the header of the encoded signal.
2. A method of mobile telecommunications for sending a signal encoded after being sampled in a specified sampling cycle, with a header used for controlling added thereto, comprising a step of adding a bit error correcting code capable of error correction of only specified amounts of signals to specified amounts of signals placed most apart from the header of the encoded signal.
3. A method of mobile telecommunications for sending a signal encoded after being sampled in a specified sampling cycle, with a header used for controlling added thereto, comprising a step of adding a burst error correcting code capable of error correction of only specified amounts of signals is added to the specified amounts of signals placed most apart from said header of the encoded signal.
4. The method of mobile telecommunications described in the above item 2 or 3 wherein an error correcting code capable of error correction of only data placed between headers neighboring each other and placed in an intermediate position apart from both headers neighboring each other is added to the data placed in the intermediate position between headers.
5. A method of mobile telecommunications for sending a signal encoded after being sampled in a specified sampling cycle, comprising steps of causing a plurality of kinds of distinguishable sending data to exist mixedly in the signal to be sent, of weighting each sending data depending on its importance and of improving more error correction capabilities of an error correcting code to be added to the sending data if the sending data is of higher importance.
6. A method of mobile telecommunications for sending a signal encoded after being sampled in a specified sampling cycle, comprising a step of adding, if voice data is contained in the signal to be sent, an error correcting code only to sending data being equivalent to a high order bit group obtained after an interleave processing.
7. A method of mobile telecommunications for sending a signal encoded after being sampled in a specified sampling cycle, comprising a step of adding, if data to be fed back when compression encoding is made is contained in said signal to be sent, an error correcting code only to sending data being equivalent to the feedback data.
8. A method of mobile telecommunications for sending a signal encoded after being sampled in a specified sampling cycle, comprising a step of placing, if voice data that has undergone processing of high order bits is contained in the signal to be sent, a high order bit group of said voice data contained in a sending frame and an error correcting code added to the said group near to a header while a low order bit group is placed apart from a header.

DESCRIPTION OF PREFERRED EMBODIMENTS

The best mode of carrying out the present invention will be described hereafter using various preferred embodiments with reference to the accompanying drawings.

Embodiment 1

Figure 1:
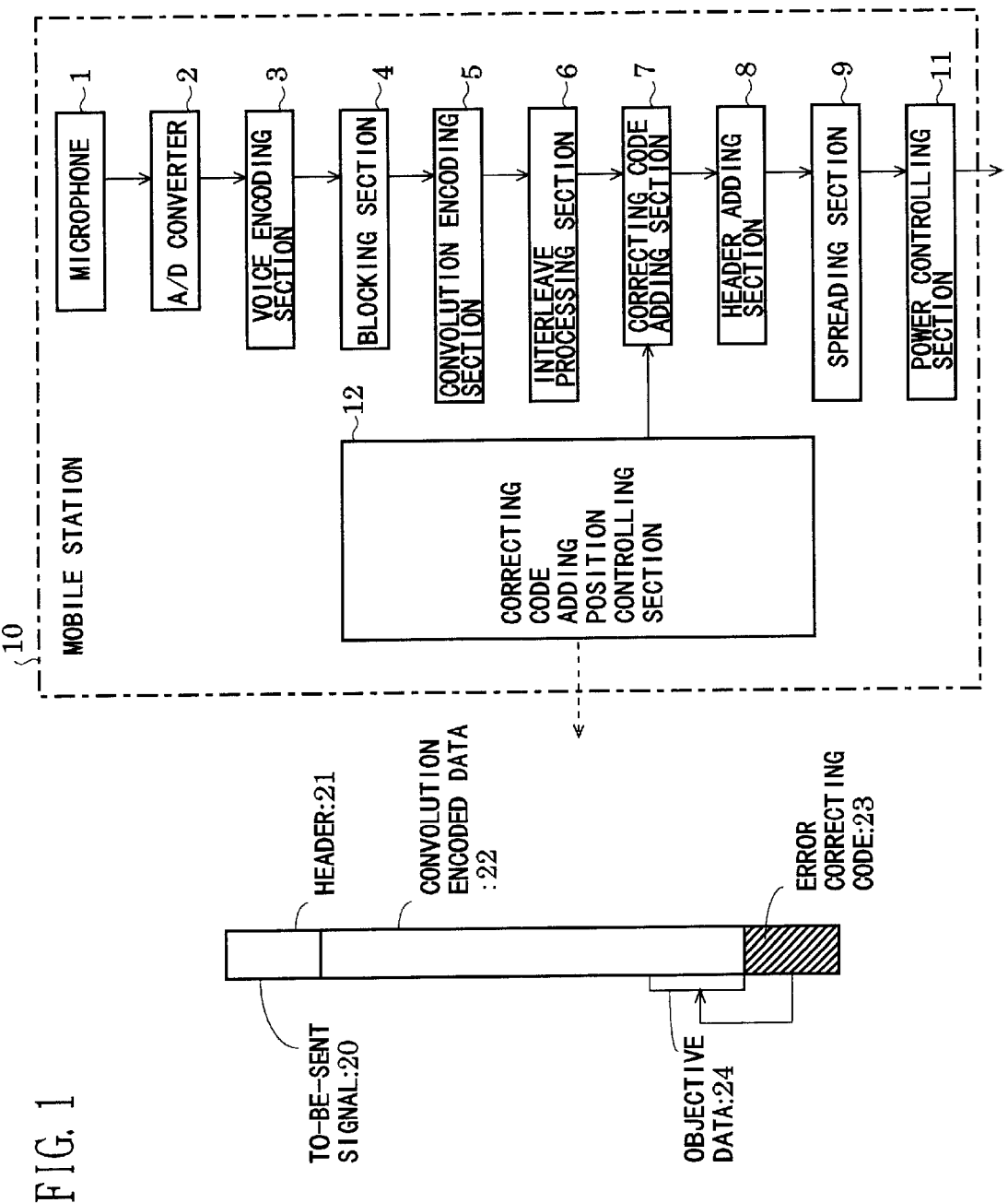
FIG. 1 is an explanatory diagram of a method for mobile telecommunications of the present invention.

FIG. 1 is an explanatory diagram illustrating the method of mobile telecommunications of the present invention. Referring now to FIG. 1, there are illustrated a concrete block diagram of a mobile station 10 and contents of signals to be sent. A mobile station 10 is provided with a microphone 1, A/D (Analog/Digital) converter 2, voice encoding section 3, blocking section 4, convolution encoding section 5, interleave processing section 6, correcting code adding section 7, header adding section 8, spreading section 9 and power controlling section 11. In addition, to the correcting code adding section 7, a correcting code adding position controlling section 12 is connected. The microphone 1 shown in the diagram is a device used to convert a voice inputted by a user of the mobile station 10 to an electrical signal. The A/D converter 2 is a device used to convert an analog signal inputted from the microphone 1 to a digital signal. The voice encoding section 3 is a device used to sample an output from the A/D converter 2 in a specified sampling cycle and then to compress and encode a group of the sampled signals. The blocking section 4 is a device used to partition an output from the voice encoding section 3 into a predetermined amount of blocks and to send out the signals in units of blocks to the convolution encoding section 5. The convolution encoding section 5 is a device used to perform convolution encoding processing of a signal fed from the blocking section 4. To signals which have undergone the convolution encoding processing, a redundant bit having a function of error correction is added. This redundant bit is a signal produced by processing called "convolution encoding" which is well known in the art but different from an error correcting code to be added in the correcting code adding section 7 described later.

The interleave processing section 6 is a device used to carry out processing of an input signal in units of blocks in such a manner as described later by referring to FIG. 5 and to output convolution encoded data 22 the order of which has been transposed. The correcting code adding section 7 is a device used to receive an output from the interleave processing section 6 and to add an error correcting code 23 as shown in the lower part of FIG. 1 to part of the convolution encoded data 22. Moreover, an objective data 24 to which this error correcting code 23 is to be added is specified by the correcting code adding position controlling section 12. For example, if the correcting code adding section 7 serially receives a digital signal outputted from the interleave processing section 6, while this signal is being stored on a buffer memory, the correcting code adding section 7 is adapted to read the objective data 24 placed at an address specified by the correcting code adding position controlling section 12 and to produce an error correcting code. The correcting code adding section 7 adds the produced error correcting code to a position adjacent to the objective data.

The header adding section 8 is a device used to add a header 21 to the convolution encoded data 22 and to produce a to-be-sent signal 20. The spreading section 9 is a device used to spread and encode an output from the header adding section 8. The power controlling section 11 is a device used to send out an output from the spreading section 9 to a transmission circuit (not shown).

The mobile station 10 as shown in this embodiment is characterized in that, unlike a conventional mobile station, it is provided additionally with the correcting code adding section 7 and the correcting code adding position controlling section 12. Because configurations and functions of other parts of the mobile station are the same as for conventional ones, detailed description has been omitted.

This mobile station 10 is adapted to send a signal 20 through a transmission circuit (not shown). This signal consists of a header 21, convolution encoded data 22 and error correcting code 23. The header 21 is produced by the header adding section 6 and added as described above which includes a variety of signals for controlling the communications. The convolution encoded data 22 is an output from the interleave processing section 6. In the conventional method, an error correcting code has been added to a blocked signal, which has been then encoded and further a header has been added thereto in order to produce a to-be-sent signal. However, in the embodiment of the present invention, an error correcting code is not added until the convolution encoding processing is completed and the error correcting code 23 is added to data which has already undergone the convolution encoding processing.

In addition, the error correcting code 23 is added to only specified objective data 24 placed apart from the header 21 out of the convolution encoded data 22. For example, if the convolution encoded data 22 consists of N (numbers) blocks, the error correcting code 23 is added to the N-th block only. This error correcting code 23 has a function of correcting a bit error of the objective data 24 and detecting the bit error, or of correcting a burst error.

Furthermore, the error correcting code is, by its nature, added to a position directly adjacent to data the error of which is to be detected and/or corrected in such a manner that the error correcting code can be distinguished from the data. Therefore, in the description hereinafter, the expression that "an error correction code is added to objective data" represents that error correcting data is produced to be used for the addition to the objective data and is added to a position directly adjacent to the objective data.

Because the length of the objective data is predetermined to be, for example, one block, the position and range of the objective data is easily distinguishable in the convolution encoded data. The length of the error correcting code is also predetermined, enabling it to be distinguished from the objective data.

The reason why such an error correcting code is used is described below.

Generally, the header 21 has been utilized by a receiver unit for phase synchronization of a received signal. Therefore, a signal placed near to the header is in synchronization and is relatively hard to cause a receiving error. However, because a signal placed apart from a header tends to produce a great phase shift, a receiving error arises easily. To solve this, an error correcting code allowing error correction of only a predetermined amount of objective data placed most apart from a header is added and the addition of an error correcting code to other parts is omitted, thereby succeeding in reducing information contents.

Moreover, a redundant bit of a convolution encoded signal takes charge of error correction of a signal placed near to a header. By adding the error correcting code 23 in addition to the redundant bit of the convolution encoded code to the signal placed apart from the header, the error correction function in the part thereof has been strengthened. Such a configuration allows the omission of the processing of adding uniform error correction codes to be performed prior to the convolution encoding of a signal and further the reduction of overall information contents thereby reducing transmission power. Also, even if the processing of adding uniform error correction codes is carried out prior to the convolution encoding of a signal as in the conventional methods, because the signal undergoes the convolution encoding and an error correcting code is added specifically to objective data which tends to easily cause an error as described above, a signal having an extreme high reliability can be sent accordingly.

Additionally, the receiver unit is adapted to detect an error correcting code added to the end of convolution encoded data and, by using the error correcting code detected, to recognize the part of the objective data the error of which is to be detected and corrected. Then, if there is an error in the objective data, error correction is made by the error correcting code and other convolution encoded data is transferred to succeeding circuits.

As the subsequent processing is the same as that for a conventional receiver, though its drawing has been omitted, the transferred signal is decoded by a de-interleave processing section which performs processing reverse to that of the interleave processing section 6 shown in FIG. 1 and by a Viterbi decoding section which performs processing reverse to that of the convolution encoding section 5. The Viterbi decoding section makes an error correction of the whole inputted signals by using redundant bits contained in the convolution encoded signals.

As described above, by having the error correcting code 23 included only in specified objective data placed apart from the header 21 of the to-be-sent signal 20, information contents to be sent can be reduced more compared with the case where error correction codes are added to all parts of the convolution encoded data 22. This allows reduction in transmission power with excellent capabilities of error correction maintained.

Embodiment 2

A variety of error correcting codes are known. In any case, the error correcting code is produced based on contents of data the error of which is corrected and is sent with it added to the data. The receiver then detects an error bit contained in the objective data by using the error correcting code to make error correction thereof.

Figure 2:
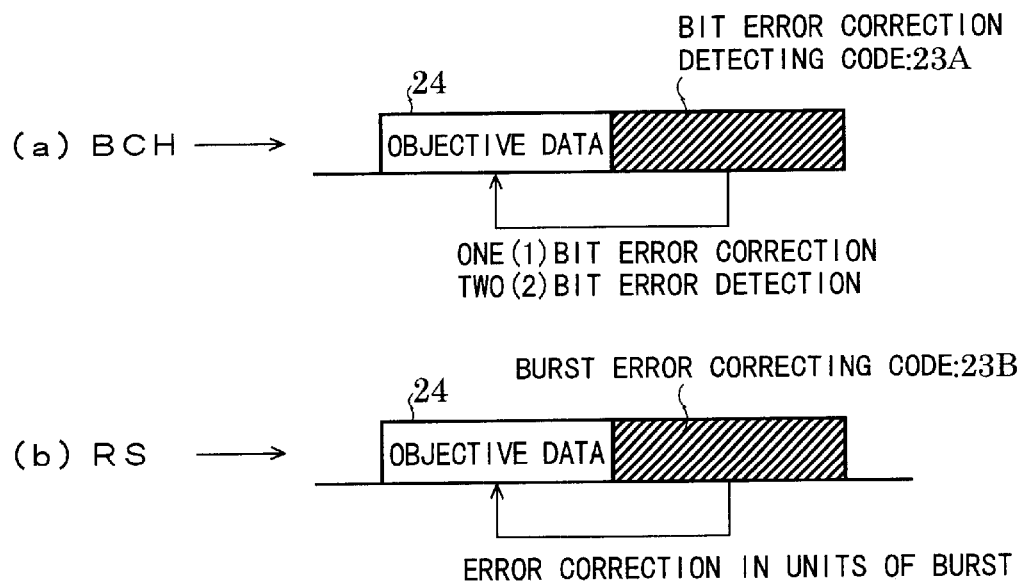
FIG. 2 is an explanatory diagram showing effects of error correction.

FIG. 2 is an explanatory diagram showing types of an error correcting code and the effect of error correction.

FIG. 2 (a) is an explanatory diagram of contents of a bit error correction detecting code 23A according to a known BCH method. As shown in the drawing, a code allowing the correction of one (1) bit error and the detection of two (2) bit error is called a "Hamming code" which has been used widely for data communications. With the use of this Hamming code, data error of one bit contained in, for example, objective data 24 shown in FIG. 2 can be detected and corrected and its original signal can be obtained. If data of two bit errors is contained, its correction is impossible but its detection is possible, and therefore the whole frame containing, for example, this objective data 24 can be abandoned if desired.

If a bit count of the bit error correction detecting code 23A is increased, its capability of error correction or detection can be made higher. This means that if the length of the objective data 24 requiring correction which is contained in the convolution encoded data 22 shown in FIG. 1 is larger, the bit length of the bit error correction detecting code 23A may be made larger accordingly. Also, there is a way wherein the objective data is adequately partitioned and the bit error correction detecting code 23A may exist mixdely between the partitioned data.

FIG. 2 (b) is an explanatory diagram of contents of a burst error correcting code 23B according to the RS method. The RS code is called a "Reed Solomon" code which has been used for error correction of a symbol. One symbol consists of a plurality of bits. If one symbol consists of 8 bits, one symbol represents one character code. With the use of this code, an error in the character code can be detected and the character code can be corrected as a whole. Thus, an error arisen in consecutive group of data is called a "burst error" and a code for the correction of burst error such as the RS code is called a "burst error-correcting code". By combining the burst error-correcting code with the convolution encoded data, strong error correction function can be implemented. In the radio communications in particular, a burst error is apt to arise in objective data 24 placed apart from the header due to a phase shift. By the addition of the burst error-correcting code 23B to the data, the reliability of to-be-sent signal can be improved.

As described above, by adding a bit error correction detecting code or burst error-correcting code to specified objective data contained in the convolution encoded data as described in Embodiment 1, mobile telecommunications of high reliability, high capability of error correction and with reduced power consumption can be made available.

Embodiment 3

In this Embodiment, further optimization of a position of objective data to which an error correcting code is added is achieved.

Figure 3:
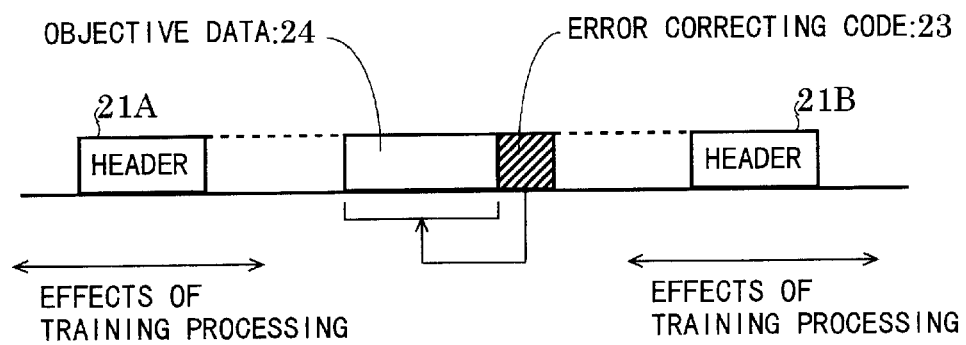
FIG. 3 is an explanatory diagram showing effects of training processing.

FIG. 3 is an explanatory diagram showing effects of training processing. On the side of a receiver unit in mobile communications, in order to synchronize signals and process convolution encoded data, training processing including phase matching relative to a position of the header 21A is carried out. As illustrated by an arrow in FIG. 3, the training processing exerts an effect on forward and backward positions of each of the header 21A and 21B, and data placed in the forward and backward positions relative to the header 21A is best in phase. That is, as shown in the drawing, when convolution encoded data placed between the headers 21A and 21B is noted, an error is apt to arise most in the objective data 24 placed in the intermediate position between and most apart from both headers 21A and 21B. In this Embodiment, an error correcting code 23 having an error correction function is produced only for this objective data and added to the convolution encoded data. That is, the addition of the error correcting code to the convolution encoded data other than the objective data 24 shown in FIG. 3 is omitted. The receiver unit is adapted to detect an error correcting code 23 contained in convolution encoded data and, after the completion of the detection of an error using the error correcting code, it then recognizes the range of the objective data to be corrected to carry out error correction processing. Other data, as it is, is transferred to succeeding circuits. In addition, for example, if the convolution encoded data has N blocks in length, it is most preferable to add an error correcting code to the block placed in the position of the N/2-th block or near thereto accordingly.

Thus, in the case of data placed between headers neighboring with each other, by adding an error correcting code only to objective data placed in the intermediate position between and most apart from both headers, mobile telecommunications with reduced transmission power as a whole and of high capabilities of error correction can be made available.

Embodiment 4

As described above, a signal to be sent contains a variety of sending data such as a header, convolution encoded data and the like. The reduction in transmission power as a whole is made possible, as in the case of Embodiments described above, by selecting data of relatively high importance and considered necessary to have an error corrected and by adding an error correcting code having a function to correct these signals only. Moreover, an error correcting code having a higher capability to correct an error contains larger information contents and the same result as above can be obtained by weighting an error correcting code to be added to each sending data in accordance with importance and by adding an error correcting code having a higher capability to correct an error to sending data of higher importance accordingly.

Figures 4, 5:
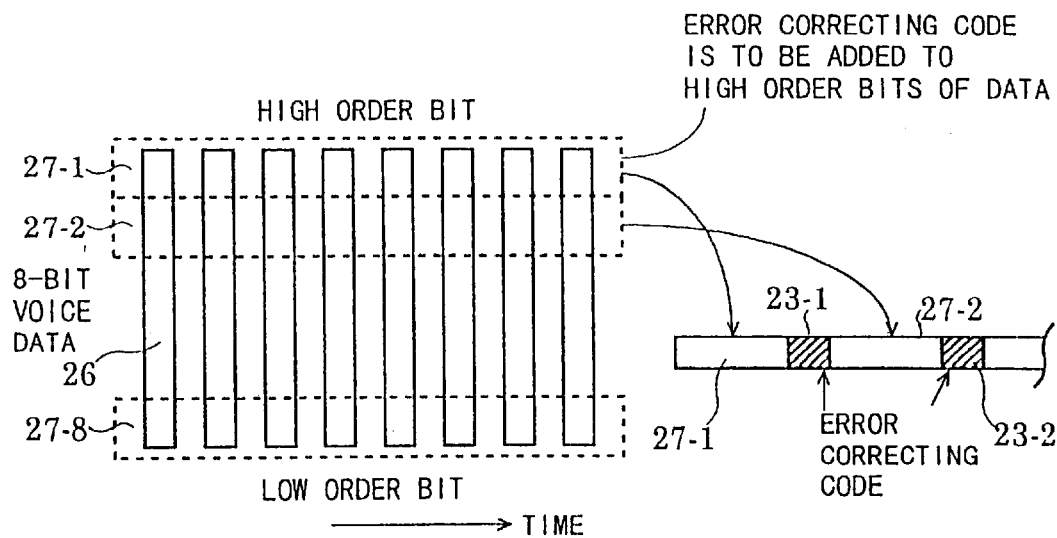
FIG. 4 is an explanatory diagram of an example showing sending data of high importance.
FIG. 5 is an explanatory diagram showing an example showing processing of high order bits.

FIG.4 is an explanatory diagram of an example showing sending data of high importance. Data A to D shown in FIG. 4 is an example of sending data each having relatively high importance. The data A is data placed apart from the header contained in the convolution encoded data described above. Because the whole convolution encoded data can be reproduced accurately by making a correction of an error in this data, the data A has high importance. The data B is quality information called "QOS".

The data C are high order bit part of a multivalued voice signal. For example, in the case of a voice signal, even if some errors arise in low order bit part, when high order bits are faithfully reproduced, great deterioration in tone quality does not occur. If the high order bit part is damaged, faithful reproduction of a voice is impossible. Therefore, high order bits are important data. The data D is feedback data referenced when compression encoding is made. The feedback data referenced repeatedly when the compression encoding is made is of high importance. Because these data examples are of high importance, error correcting codes are added to these data examples only.

When the data is numbered in the order of importance, if the order of the data is, for example, A, B, C and D, an error correcting code having high error correction capability is added in this order. That is, an error correcting code having highest correction capability is to be added to the data of highest importance. No error correcting code is added to other data.

Thus, the reliability in the whole signals to be sent is improved by adding an error correcting code having higher capability of error correction to data of higher importance. Also, sending and receiving of signals with reduced transmission power are made possible by reducing the whole information contents through methods wherein error correction capability in the error correcting code to be added to data of relatively lower importance is made less or no error correcting code is added to such less important data.

Embodiment 5

FIG. 5 is an explanatory diagram showing an example showing processing of high order bits. To send a voice digital signal, the order of signals is repositioned by "processing of high order bits" as shown in FIG. 5. By sampling a voice waveform and digitizing a signal, voice data 26 as shown in the drawing is obtained. In the example, each voice data 26 is represented by an 8-bit digital signal. For example, all of 8-bit voice data 26 contained in one block is sliced one by one bit from the high order bit part in turn. By this slice, 8 kinds of data containing bit groups 27-1~27-8 can be obtained as shown in FIG. 5. This processing is called "bit slice". Each data consisting of the bit group is taken out in the order of high order bit groups 27-1, 27-2 and so on and is aligned serially and then sent out. The interleave processing section 6 shown in FIG. 1 is adapted to perform this processing.

As described above, the high order bit groups 27-1 and 27-2 are the most important among other groups in the voice data. Therefore, the error correcting code is added only to, for example, high order bit group 27-1 or 27-2. As shown in FIG. 5, the error correcting code 23-1 is added to the high order bit group 27-1 and then the error correcting code 23-2 is added to the high order bit group 27-2. No error correcting code is added to other low order bit group. This results in the reduction of amounts of the whole error correcting codes and of transmission power Further, in this Embodiment, the following processing is carried out.

Such processing of high order bits as described above is repeated by a certain amount of data groups, for example, of one block. However, as described above, an error may not arise easily in data placed near to a header and may arise easily in data placed apart from a header. Therefore, due to the re-positioning of data by having high order bits of each data group concentrated near to a header and by having low order bits of each data group positioned apart from a header, signal of high reliability can be sent with the minimized capability of error correction. This processing is called "processing of high order bits".

Figure 6:
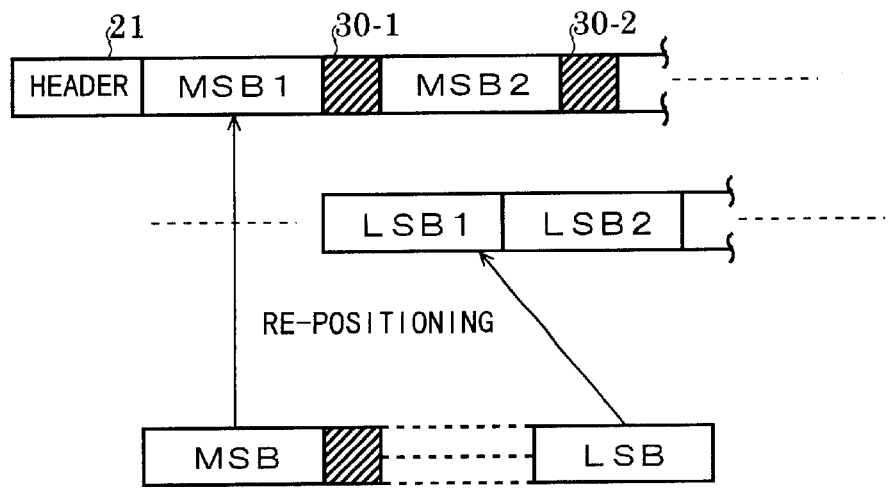
FIG. 6 is an explanatory diagram of an example showing repositioning of data.

FIG. 6 is an explanatory diagram illustrating such processing.

As shown in the drawing, next to a header 21, MSB 1 being equivalent to the highest order bit part is positioned, to which an error correcting code 30-1 is added. Next to the error correcting code 30-1, MSB 2 being equivalent to the highest order bit part of another block is positioned, to which an error correcting code 30-2 is added. Low order bit LSB1 and LSB are placed apart from the header 21. For example, in the case of sending data being equivalent to 10 blocks, next to the header 21, the highest order bit group covering 10 blocks is placed. Next to that, the second highest order bit group covering 10 blocks is placed. In the last, the eighth highest order bit group covering 10 blocks is placed.

As shown in the above Embodiment, if an error in low order bit LBS1 and LBS2 is permissible to some extent, by adding an error correcting bit only to the highest order bit MSB1 or MSB2, a signal of high quality is made available. Also, if an error may not arise easily in data placed near to a header, as seen in Embodiment 1, by adding an error correcting code only to low order bit data placed apart from a header, reliability of the whole signal can be improved.

Embodiment 6

Figure 7:
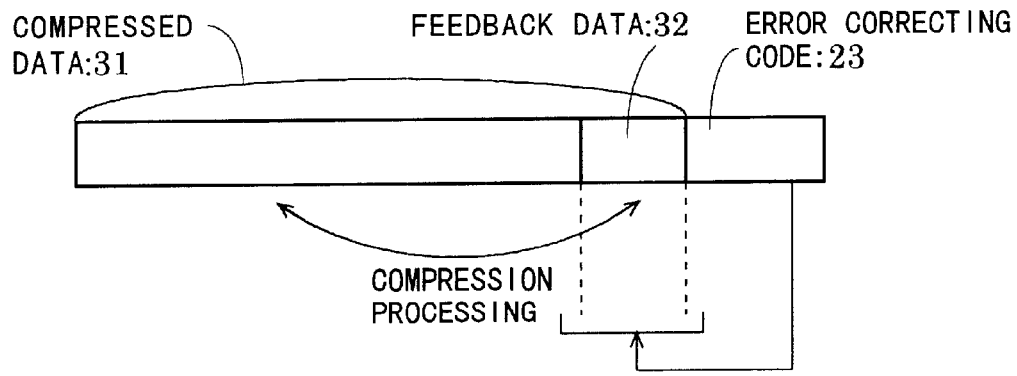
FIG. 7 is an explanatory diagram of an example showing feedback data processing.

FIG. 7 is an explanatory diagram of feedback data. This shows a more concrete content of an example wherein an error correcting code is added to the feedback data described above. The compressed data 31 shown in FIG. 7 is data obtained by being compressed from the head of the data in turn by referring to the feedback data 32. Therefore, to expand the compressed data, the feedback data 32 is referred again. Thus, the feedback data 32 is more important data compared with other parts of data. To increase capability of error correction in this part, directly next to the feedback data, an error correcting code 23 is added.

Not only in Embodiment 6 but also in Embodiments 4 and 5, it is shown that sending of a signal of high quality with reduced transmission power is made possible by adding an error correcting code having high capability of error correction to data requiring such capability depending upon the importance of each sending data and by omitting the addition of an error correcting code to data not requiring such capability when a plurality of kinds of distinguishable data exist mixedly in a signal to be sent.

Additionally, in all Embodiments shown above, processing wherein the mobile station as shown in FIG. 1 generates a to-be-sent signal 2 and sends it has been described, however, this processing can be applied to sending of signals at a base station communicating with a mobile station as well.

What is claimed is:

1. A method of mobile telecommunications for sending a signal encoded after being sampled in a specified sampling cycle, with a header used for controlling added thereto, comprising a step of adding an error correcting code capable of error correction of only specified amounts of signals to specified amounts of signals placed farthest from said header of said encoded signal.

2. The method of mobile telecommunications of claim 1, wherein the error correcting code is a bit error correcting code.

3. The method of mobile telecommunications of claim 1, wherein the error correcting code is a burst error correcting code.

4. A method of mobile telecommunications for sending a signal encoded after being sampled in a specified sampling cycle, with a header used for controlling added thereto, comprising a step of adding an error correcting code capable of error correction of only data placed between headers neighboring each other and placed in an intermediate position apart from both headers neighboring each other, wherein the error correcting code is a burst error correcting code.

5. A method of mobile telecommunications for sending a signal encoded after being sampled in a specified sampling cycle, comprising the steps of:

providing a to-be-sent signal comprising a header and encoded data;

determining an error correcting code only for a portion of said encoded data furthest from said header; and including said error correcting code in said to-be-sent signal at a nonadjacent position to said header.

6. The method of mobile telecommunications of claim 5, wherein said error correcting code is included at a position furthest from said header.

7. The method of mobile telecommunications of claim 5, wherein said error correcting code is included adjacent to said portion of said encoded data.

8. The method of mobile telecommunications of claim 5, wherein the error correcting code is a bit error correcting code.

9. The method of mobile telecommunications of claim 5, wherein the error correcting code is a burst error correcting code.

10. A method of mobile telecommunications for sending a signal encoded after being sampled in a specified sampling cycle, comprising the steps of:

providing a to-be-sent signal comprising a header and encoded data;

determining an error correcting code only for a portion of said encoded data being at an intermediate position of said encoded data between said header and a header of an adjacent to-be-sent signal and nonadjacent to either header; and including said error correcting code in said to-be-sent signal at a nonadjacent position to either header.

11. The method of mobile telecommunications of claim 10, wherein said intermediate position of said encoded data is around a middle of said encoded data.

12. The method of mobile telecommunications of claim 10, wherein said error correcting code is included adjacent to said portion of said encoded data.

13. The method of mobile telecommunications of claim 10, wherein the error correcting code is a bit error correcting code.

14. The method of mobile telecommunications of claim 10, wherein the error correcting code is a burst error correcting code.

* * * * *